United States Patent [19]

Ray

[11] 4,220,876
[45] Sep. 2, 1980

[54] BUS TERMINATING AND DECOUPLING CIRCUIT

[75] Inventor: Kenneth I. Ray, Mesa, Ariz.

[73] Assignee: Motorola, Inc., Schaumburg, Ill.

[21] Appl. No.: 934,447

[22] Filed: Aug. 17, 1978

[51] Int. Cl.³ .......................... H03K 3/01; H03K 3/26
[52] U.S. Cl. ............................... 307/296 R; 307/363; 307/317 R; 307/237
[58] Field of Search ............... 307/296, 350, 363, 237, 307/310, 254, 317 R

[56] References Cited

U.S. PATENT DOCUMENTS

| | | | |
|---|---|---|---|
| 3,204,120 | 8/1965 | Naken | 307/363 |
| 3,553,486 | 1/1971 | Dow | 307/237 |
| 4,163,161 | 7/1979 | Walker | 307/296 R |

Primary Examiner—Stanley D. Miller, Jr.
Assistant Examiner—B. P. Davis

Attorney, Agent, or Firm—Maurice J. Jones, Jr.

[57] ABSTRACT

The bus terminating circuit isolates itself from a bus in response to the magnitude of a power supply voltage decreasing below a predetermined threshold level. The bus terminating circuit includes a bus termination voltage divider network having one terminal coupled through a threshold sensing device to one of the pair of power supply terminals, another terminal coupled to the bus and a further terminal coupled through a transistor to the other of the pair of power supply terminals. Another threshold sensing circuit is coupled between one of the pair of power supply terminals and the control electrode of the transistor. The threshold sensing circuits are responsive to the magnitude of the power supply voltage falling below the predetermined threshold level to render devices of the threshold sensing circuits non-conductive and thereby electrically isolate the bus termination network from the bus.

11 Claims, 3 Drawing Figures

BUS TERMINATING AND DECOUPLING CIRCUIT

BACKGROUND OF THE INVENTION

Many types of modern day electronic equipment utilize bus systems each of which includes a plurality of electrical lines used to receive and distribute information from a plurality of subsystems which are connected to the bus. More specifically, some electronic testing systems include a controller element such as a minicomputer and a plurality of instruments and a display or printer which are interconnected by a general purpose interface bus. The bus enables information to be routed back and forth between the various instruments, the controller and the display or printer.

Each instrument includes a bus termination network which is connected to the bus and provides quiescent voltages on the bus when the bus is not in use. These termination networks also reduce the magnitudes of unwanted oscillating signals on the bus to an acceptable level.

Prior art termination networks include a discrete voltage divider circuit having one resistor connected from the bus to the positive power supply terminal and another resistor connected from the bus to ground. The electrical power provided to the voltage divider is derived directly from the instrument itself. The foregoing discrete resistive termination network typically provides a quiescent direct current voltage on the bus of approximately 3 to 3.5 volts.

For some tests, for instance, it may be desirable to utilize less than all of the instruments connected to a particular bus. When some of the instruments connected to the bus are turned off, the resistors of the termination networks thereof provide a degrading effect on the bus because such resistors tend to pull the quiescent and signal voltage magnitudes on the bus to a lower level. As the number of instruments that are turned off increases, the degrading effect becomes increasingly worse because the loading caused by the termination networks increases. Consequently, it has been necessary in the past for at least one-half of the instruments or other subsystems connected to a given bus to remain operative whether they are being utilized or not so as to not undesirably load down the bus. Consequently, such subsystems are oftentimes powered on when they are not needed thereby decreasing the life of such subsystems and causing a waste of electrical power. Moreover, when only the minimum number of instruments are powered on, the degrading effect of the subsystems connected to the line which are powered off may in some instances degrade the magnitude of logical "1's" to the extent that they may be interpreted as logical "0's" thereby causing erroneous information to be passed through the bus.

SUMMARY OF THE INVENTION

Accordingly, one object of the present invention is to provide a bus terminating and decoupling circuit which essentially disconnects or electrically isolates an electrical system or subsystem from a bus in response to such system or subsystem being turned off so that the bus continues to operate as if that system or subsystem was not connected thereto.

Another object of the invention is to provide a bus termination circuit which allows any number of systems or subsystems connected to the bus to be turned off without degradation in the bus operation.

A further object of the invention is to provide a bus decoupling circuit which is simple, reliable and suitable for being manufactured in monolithic integrated circuit form.

Briefly, the bus terminating circuit of one embodiment is self-decoupling from a bus in response to the magnitude of the power supply voltage across the power supply terminals decreasing below a predetermined threshold level. The bus terminating circuit includes a bus termination network, an electron control device and a threshold sensing circuit. The bus termination network is coupled to one of the pair of power supply terminals and to the bus. The electron control device has a pair of main electrodes one of which is coupled to the bus termination network. The threshold sensing circuit is coupled between one of the pair of power supply terminals and the control electrode of the electron control device. The threshold sensing circuit is responsive to the magnitude of the power supply voltage falling below the predetermined threshold level to render the electron control device non-conductive and thereby isolate at least a portion of the bus termination network from the bus.

DETAILED DESCRIPTION OF THE PREFERRED EMBODIMENT

Figure 1:
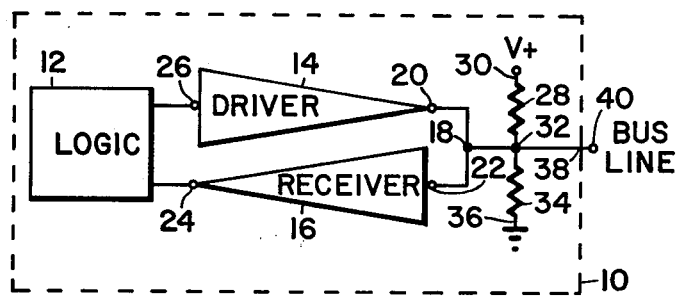
FIG. 1 shows prior art resistive termination network connected to a bus line, a line driver and a line receiver.

FIG. 1 is a partial block and schematic drawing of part of an instrument or other electronic device 10 having a logic portion 12, a line driver 14, and a line receiver 16. Terminal or node 18 is connected to both the output terminal 20 of line driver 14 and the input terminal 22 of receiver 16. Output terminal 24 of receiver 16 is connected to logic block 12 and input terminal 26 of driver 14 is connected to logic block 12.

The prior art bus termination network includes a discrete resistor 28, which is connected between power supply terminal 30 of instrument 10 and node 32. Discrete resistor 34 which is connected between node 32 and ground or reference terminal 36 is also included in the termination network. Node 32 is connected through terminal 38 to bus 40. Resistors 28 and 34 form a voltage divider. Generally, each bus line 40 is connected to a plurality of instruments and hence to a plurality of nodes corresponding to node 32. If the power for instrument 10 is on, for instance, the voltage divider including resistors 28 and 34 tends to bias node 32 and hence bus line 40 at a predetermined quiescent voltage magnitude. When power for instrument 10 is turned off, however, the magnitude of the voltage on terminal 30 falls to zero. Consequently, resistors 32 and 34 then tend to load bus 40. As other instruments connected to bus 40 are also turned off, the resistances of the resistors of the termination networks thereof corresponding to resistor 32 and 34 tend to combine in parallel with the resistance of resistors 32 and 34 thereby increasing the load on bus 40 and decreasing the magnitude of the quiescent and signal voltages thereof. Thus, there is a definite maximum limit on how many "off" instruments or other "off" systems can be connected to bus 40 and still allow bus 40 to function.

Figure 2:
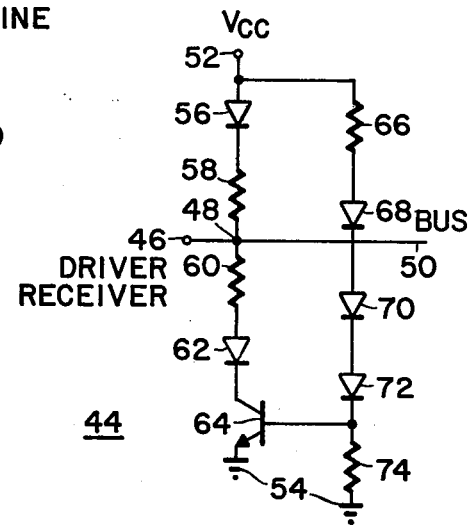
FIG. 2 is a schematic diagram of a bus termination and decoupling circuit of one embodiment of the invention.

Monolithic circuit 44 of FIG. 2 has been developed to overcome the loading problems associated with the termination network of FIG. 1, which includes resistors 28 and 34. Bus terminating and decoupling circuit 44 includes an input terminal 46 which can be coupled to a line driver and receiver, and to a node 48, which can be coupled to a bus 50. Circuit 44 further includes two substantially parallel circuit paths extending between positive power supply terminal 52 and ground or reference terminal 54. One of these paths includes diode 56 which is connected in series with resistor 58 between supply terminal 52 and node 48. Resistor 60, diode 62 and the collector-to-emitter or main path of NPN transistor 64 are connected in series between node 48 and ground terminal 54. Resistors 58 and 60 provide the desired bus termination network.

The other series path of bus terminating and decoupling circuit 44 includes resistor 66 which is connected in series with threshold determining diodes 68, 70, 72 to the base or control electrode of transistor or electron control device 64. Resistor 74 is connected between the base electrode of transistor 64 and ground terminal 54.

Figure 3:
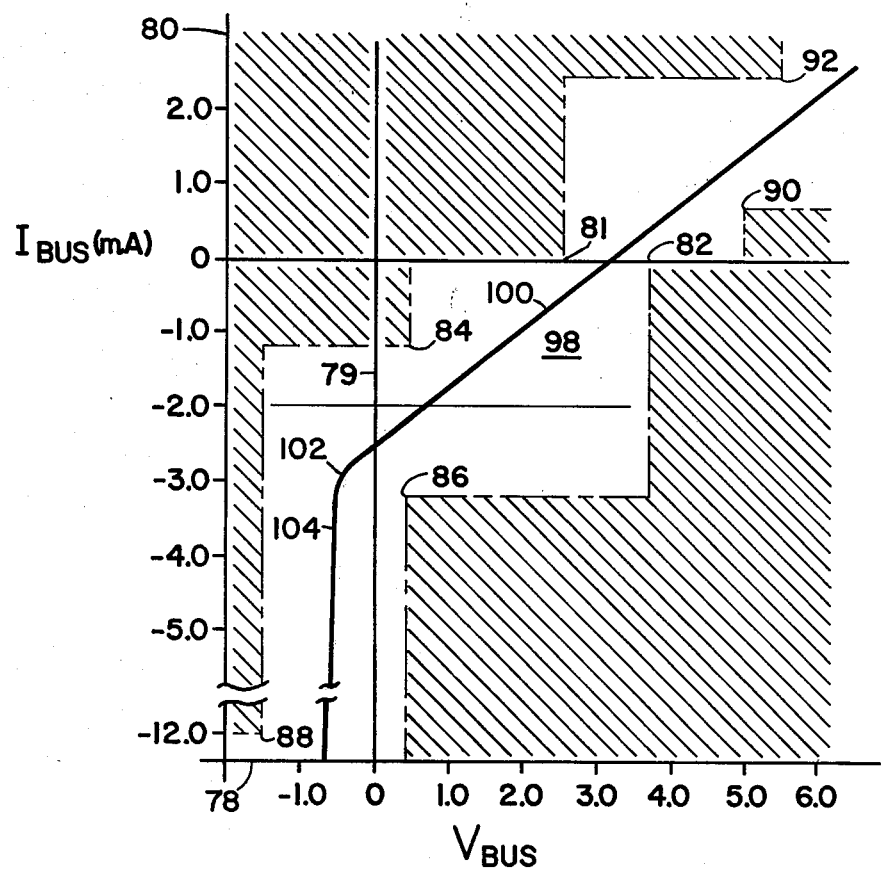
FIG. 3 is a graph of a desired relationship between the bus voltage and bus current facilitated by the bus termination circuit of FIG. 2.

FIG. 3 shows the relationship between the bus voltage, $V_{BUS}$, which is plotted along abscissa axis 78 and the bus current, $I_{BUS}$, which is plotted along ordinate axis 80 for characterizing the desired normal operation of circuit 44. This characteristic is defined by a plurality of points plotted on the plane defined by axes 78 and 80. More particularly, it is desirable that the magnitude of the voltage on bus 50 be at least 2.5 volts if zero current is flowing therein as defined by point 81. Further, it is desired that the maximum voltage on bus 50 be no more than 3.7 volts with zero current flowing as defined by point 82. If the voltage on bus 50 is forced to a value of 0.4 volt then it is desired that the minimum current flowing in bus line 50 be −1.3 milliamps as defined by point 84 and that the maximum current be −3.2 milliamps as defined by point 86. If a current more negative than −12 millivolts is applied to bus 50 then it is desired that the bus voltage be clamped to less than −1.5 volts. Thus, the voltage is less than −1.5 volts at −12 milliamps as indicated by point 88. This clamping action is performed by a diode in the input of the line receiver. If the voltage on bus 50 is forced to 5 volts, it is desired that that current be greater than 0.7 of a milliamp as indicated by point 90. Also, it was desired that if a voltage of 5.5 volts is provided on bus 50 that no more than 2.5 milliamps flow, as indicated by point 92.

Thus, the foregoing seven points define the voltage and current characteristics that are facilitated on bus 50 under normal operation of circuit 44. The shaded areas of FIG. 3 indicate forbidden regions for the voltage-to-current characteristics and the unshaded regions indicate desired areas. Curve 98 indicates one nominal voltage and current characteristic provided to bus line 50 under normal operation. Although curve 98 is a typical characteristic, it is to be kept in mind that it is only required that the characteristic remain within the non-shaded area of FIG. 3. Generally, the voltage divider network including resistors 48 and 60 provide the sloped portion 100 above bend 102 of curve 98. A diode to ground in the input of the line receiver provides the clamping indicated by portion 104 and bend 102.

Referring now to FIG. 2, when a voltage of sufficient magnitude is applied to terminal 52 of circuit 44, current flows through resistor 66 and forward biased diodes 68, 70 and 72 to the base of transistor 64. This current causes transistor 64 to turn on and saturate. As a result, current then flows through diode 56, resistors 58 and 60, diode 62 and the collector-to-emitter path of transistor 64. Since diodes 56, 62 are forward biased and transistor 64 is saturated, resistors 58 and 60 provide the desired termination characteristic 100 of curve 98 of FIG. 3, essentially as though only resistors 58 and 60 were connected to bus 50.

If instrument 10 is turned off, the voltage on terminal 52 falls to zero volts. As the power supply voltage magnitude becomes less than the predetermined level of about 2.5 volts, for instance, as established by the anode-to-cathode junctions of threshold setting diodes 68, 70 and 72 and the base-to-emitter junction of transistor 64, current no longer flows through the path including resistor 66 and diodes 68, 70 and 72. Consequently, transistor 64 turns off and provides a high impedance at the cathode of diode 62. Since no current is able to flow through diode 62, no current is also able to flow through resistor 60. Thus, resistor 60 appears to be disconnected or is isolated from node 48 in response to transistor 64 being rendered non-conductive. Thus, resistor 60 provides no loading to line 50 when power is removed from terminal 52. Moreover, as the power supply voltage on terminal 52 falls below another predetermined level of about 3.0 volts, for instance, threshold setting diode 56 becomes back-biased and no current can flow therethrough. Consequently, resistor 58 appears to be disconnected or isolated from node 48. Since no current flows through either resistor 58 or 60, then node 48 presents a high impedance to bus 50. Thus, circuit 44 does not load bus 50 when the system or subsystem including circuit 44 is turned off or the supply voltage magnitude falls below a predetermined threshold of 2.5 volts, which is the lower of the two thresholds.

Diode 62 compensates for the temperature characteristics of diode 56 at node 48 so that the voltage at node 48 remains substantially independent of temperature variation. For example, during normal operation as the ambient temperature increases, the voltage drop across diode 56 decreases which tends to cause the voltage at node 48 to increase. However, the voltage drop across diode 62 also tends to decrease as the ambient temperature increases which tends to lower the voltage at terminal 48. Thus, the voltage across diode 62 changes in an equal but opposite direction from the voltage change across diode 56 thereby enabling the bus voltage to not change because of diode 56. The saturation voltage between the main or collector and emitter electrodes of transistor 64 remains substantially constant over the desired temperature range.

Resistors 58 and 60 can have respective values of 1800 ohms and 3600 ohms. Resistor 66 limits the magnitude of the current which flows into the base of transistor 64 during the normal "on" condition thereof. Resistor 74 provides a current pulldown for the base transistor 64 to maintain transistor 64 in an "off" condition when no current is flowing through the threshold sensing circuit including diodes 68, 70 and 72. Consequently, transistor 64 is maintained "off" when there is zero voltage on supply terminal 52. Resistor 66 can have a resistance of approximately 10 kilohms and resistor 74 can have a resistance of approximately 20 kilohms. Resistor 74 bleeds off current which may leak across the emitter-to-base junction of transistor 64 while transistor 64 is non-conductive.

What has been described, therefore, is a bus terminating and decoupling circuit which essentially disconnects or electrically isolates an electrical system or subsystem from bus 50 in response to such system or subsystem being turned off so that bus 50 continues to operate as if that system or subsystem was not connected thereto. More specifically, diode 56 turns off as the magnitude of supply voltage, VCC, falls below a certain predetermined level thereby isolating resistor 58 from bus 50. Thus, diode 56 performs a threshold sensing function. Moreover, as the supply voltage VCC, falls below another predetermined magnitude, diodes 68, 70, 72 become no longer forward biased and transistor 64 then becomes no longer conductive. Thus, these devices perform another threshold sensing function. When transistor 64 is non-conductive then resistor 60 is also electrically isolated from bus 50. Thus, circuit 44 allows any number of systems or subsystems, each of which include circuit 44 connected to bus 50, to be turned off without degradation in the bus operation. Decoupling circuit 44 is simple, reliable and suitable for being manufactured in monolithic integrated circuit form.

I claim:

1. A bus terminating circuit which is self-decoupling from a bus in response to the magnitude of a power supply voltage across a pair of power supply terminals decreasing below a predetermined threshold level, including in combination:

bus termination network means having one terminal coupled to one of the pair of power supply terminals, another terminal coupled to the bus and a further terminal;

electron control means having a pair of main electrodes and a control electrode, one of said main electrodes being coupled to said bus termination network, the other of said main electrodes being coupled to the other of said pair of power supply terminals; and first threshold sensing means coupled between one of the pair of power supply terminals and said control electrode of said electron control means, said first threshold sensing means including a plurality of semiconductor junctions, said first threshold sensing means being responsive to the magnitude of the power supply voltage falling below the predetermined threshold level to render said electron control means non-conductive to thereby electrically isolate at least a portion of said bus termination network means from the bus.

2. The bus terminating circuit of claim 1 wherein said main electrodes of said electron control means are coupled in series with said further electrode of said bus termination network means.

3. The bus terminating circuit of claim 1 further including second threshold sensing means coupled between one of the pair of power supply terminals and said bus termination network means, said second threshold sensing means electrically isolating any portions of said bus termination network means from the bus that can not be isolated by said first threshold sensing means in response to the magnitude of the power supply voltage falling below a predetermined magnitude.

4. The bus terminating circuit of claim 3 wherein said second threshold sensing means includes at least one semiconductor diode.

5. The bus terminating circuit of claim 4 further including another semiconductor diode for temperature compensating said semiconductor diode of said second threshold sensing means.

6. A bus terminating circuit which is self-decoupling from a bus in response to the magnitude of the power supply voltage across a pair of power supply terminals decreasing below a predetermined threshold level, said bus terminating circuit including in combination:

a bus termination network including a first resistive means connected between one terminal and another terminal and a second resistive means connected between said another terminal and a further terminal, said another terminal being coupled to the bus;

first circuit means coupling said one terminal of said bus termination network means to one of said power supply terminals;

transistor means having a pair of main electrodes and a control electrode;

second circuit means coupling one of said main electrodes of said transistor means to said further terminal of said bus termination network means;

said second of said main electrodes of said transistor means being coupled to said other terminal of said pair of power supply terminals; and first threshold sensing means including a plurality of semiconductor diodes being coupled between said one of said pair of power supply terminals and said control electrode of said transistor means, said first threshold sensing means being responsive to the magnitude of the power supply voltage falling below the predetermined threshold level to render said transistor means non-conductive and thereby electrically isolate said second resistive means of said bus termination network means from the bus.

7. The bus terminating circuit of claim 6 wherein said first circuit means includes a second threshold sensing means coupled between said one terminal of said bus termination network and said one of the pair of power supply terminals, said second threshold sensing means including a semiconductor diode.

8. The bus terminating circuit of claim 7 wherein said second circuit means includes a further diode means to temperature compensate said semiconductor diode of said second threshold sensing circuit.

9. A bus terminating circuit which is self-decoupling from a bus in response to the magnitude of a power supply voltage across a pair of power supply terminals decreasing below a predetermined threshold level, including in combination:

bus termination network means having one terminal coupled to one of the pair of power supply terminals, another terminal coupled to the bus and a further terminal;

electron control means having a pair of main electrodes and a control electrode, one of said main electrodes being coupled to said bus termination network, the other of said main electrodes being coupled to the other of said pair of power supply terminals;

first threshold sensing means coupled between one of the pair of power supply terminals and said control electrode of said electron control means, said first threshold sensing means being responsive to the magnitude of the power supply voltage falling below the predetermined threshold level to render said electron control means non-conductive to thereby electrically isolate at least a portion of said bus termination network means from the bus; and second threshold sensing means coupled between one of the pair of power supply terminals and said bus termination network means, said second threshold sensing means electrically isolating any portions of said bus termination network means from the bus that can not be isolated by said first threshold sensing means in response to the magnitude of the power supply voltage falling below a predetermined magnitude.

10. The bus terminating circuit of claim 9 wherein said second threshold sensing means includes at least one semiconductor diode.

11. The bus terminating circuit of claim 10 further including another semiconductor diode for temperature compensating said semiconductor diode of said second threshold sensing means.

* * * * *